United States Patent [19]

Havemann

[11] Patent Number: 5,395,798
[45] Date of Patent: Mar. 7, 1995

[54] REFRACTORY METAL SILICIDE DEPOSITION PROCESS

[75] Inventor: Robert H. Havemann, Garland, Tex.

[73] Assignee: Texas Instruments Incorporated, Dallas, Tex.

[21] Appl. No.: 812,241

[22] Filed: Dec. 19, 1991

[51] Int. Cl.$^6$ .......................................... H01L 21/441
[52] U.S. Cl. .................................... 437/200; 437/190; 149/DIG. 147
[58] Field of Search ........................ 437/200, 190, 225; 148/DIG. 147

[56] References Cited

U.S. PATENT DOCUMENTS

| | | | |
|---|---|---|---|
| 4,690,730 | 9/1987 | Tang et al. | 156/643 |
| 4,784,973 | 11/1988 | Stevens et al. | 437/190 X |
| 5,043,300 | 8/1991 | Nulman | 437/200 |

FOREIGN PATENT DOCUMENTS 63-280417 11/1988 Japan.
3136326 11/1991 Japan.

OTHER PUBLICATIONS

Shih-Chang Chen, et al., "Formation of Titanium Nitride/Titanium Silicide by High Pressure Nitridation in Titanium/Silicon", Japanese Journal of Applied Physics, vol. 30, No. 11A, Nov. 1991, pp. 2673–2678.

Tohru Hara, et al., "Formation of Titanium Nitride Layers By the Nitridation of Titanium In High-pressure Ammonium Ambient", Applied Physics Letters, vol. 57, No. 16, Oct. 1990, pp. 1660–1662.

Primary Examiner—John S. Maples
Attorney, Agent, or Firm—Kay Houston; Richard A. Stoltz; James C. Kesterson

[57] ABSTRACT

A method for forming a refractory metal silicide on a semiconductor device is disclosed. The method comprises the steps of depositing a layer of refractory metal on the device and reacting the layer with nitrogen. The reaction is accomplished at a partial pressure of nitrogen greater than one atmosphere. The disclosed process allows thin layers of low resistance silicide to be formed for use as an ohmic contact while also forming a nitride layer for use as a device-to-device interconnection.

11 Claims, 1 Drawing Sheet ns the sheet resistance of an interconnec-

REFRACTORY METAL SILICIDE DEPOSITION PROCESS

TECHNICAL FIELD OF THE INVENTION

This invention relates in general to the field of integrated circuits and, more particularly, to a method for depositing a refractory metal silicide layer.

BACKGROUND OF THE INVENTION

Refractory metal silicide technology has been recognized as one of the keys to realizing good device performance in integrated circuits as device dimensions scale down. Titanium disilicide ($TiSi_2$) has become recognized as one of the most attractive metal silicides, because of its low resistivity, stability, and capability for self-aligned formation.

One of the major advantages of titanium disilicide technology is the availability of a self-aligned VLSI process. That is, by depositing a layer of titanium metal overall and then heating in a nitrogen atmosphere, all exposed areas of silicon (whether monocrystalline or polycrystalline) will react to form titanium disilicide. A composition dominated by titanium nitride will be formed where the titanium metal was not in contact with silicon but was instead in contact with silicon dioxide. This is tremendously useful, since, silicide may be formed on the surface of exposed source/drain regions (or other exposed substrate surface regions), on the surface of the polysilicon gate level, and nowhere else. This means that the source/drain diffusions can be made shallower while still preserving an acceptably low sheet resistance. Also the sheet resistance of an interconnection to a polysilicon gate can be lowered. The use of nitrogen atmosphere in this process is critical, since otherwise silicon would out-diffuse through the growing silicide layer and permit lateral growth. The titanium disilicide might thereby bridge gaps of approximately 0.5 $\mu$m, e.g., between the gate and source/drain of a VLSI device.

The second advantage of the titanium disilicide technology is the resulting titanium nitride (TiN) layer. This layer may be advantageously used as an interconnect layer between devices and additionally as a diffusion barrier for the underlying silicon or doped silicon region during subsequent processing steps.

Present refractory metal silicide processes, however, are being pressed by new circuit goals. In particular, 1.0 $\mu$m and sub-micron circuits imply shallow diode junctions. An overlaying silicide layer must also be shallow to be compatible with a particular diode junction. Otherwise, a silicide layer might spike through the shallow diode junction, shorting the interconnect of which it is a part to the semiconductor substrate below.

Also, thick silicide layers place undesirable mechanical stresses on a junction. These stresses reduce the reliability of the circuit. Current silicide methods first deposit a titanium layer on a substrate. The layer is typically 1000 Angstroms thick. Nitrogen at a temperature of 500° to 700° C. and at atmospheric pressure is then heated with the titanium layer. These processes typically produce 1,500 Angstroms of titanium disilicide and 400 Angstroms of titanium nitride for each 1,000 Angstroms of titanium deposited.

New 1.0 $\mu$m and sub-micron processes require the titanium disilicide layer to be only 500 Angstroms thick. This requirement implies that the deposited titanium layer be one-third the thickness deposited by older processes, or approximately 333 Angstroms thick initially. Unfortunately, refractory metals such as titanium are not easily deposited to such small thicknesses.

Alternatively, titanium may be reacted with nitrogen at a pressure less than one atmosphere. This process produces the desired higher ratio of titanium disilicide to titanium nitride. Unfortunately, this process produces almost no titanium nitride which is also desired in applications calling for a local interconnect.

Therefore, a need has arisen for a refractory metalsilicide process which is able to produce a thin silicide layer compatible with sub-micron processes yet which also produces a nitride layer for use as an interconnect.

SUMMARY OF THE INVENTION

In accordance with the present invention, a refractory metal silicide deposition process is provided which substantially eliminates or reduces disadvantages and problems associated with prior metal silicide processes.

A method for forming a refractory metal silicide on a semiconductor workpiece is disclosed. The method comprises the steps of depositing a layer of refractory metal on the workpiece and reacting the layer of refractory metal with nitrogen. The reaction is accomplished at a partial pressure of nitrogen greater than one atmosphere.

The first technical advantage of the disclosed process is the resulting thin metal silicide layer. The metal silicide layer may be reduced to only 500 Angstroms in thickness starting from a 1000 Angstrom thick layer of refractory metal. This allows the layer to be incorporated into transistors having shallow source/drain regions.

A second technical advantage of the system is the resulting refractory metal nitride layer. The thickness of this layer is maintained in the disclosed process allowing the deposited refractory metal to be used as an interconnect between devices.

A third technical advantage of the disclosed process is the decreased reaction between the refractory metal and a silicon dioxide layer such as an insulating field oxide layer. By enhancing the refractory metal nitride layer at higher pressure, lower temperatures may be used. Lower react temperatures lead to lower rates of formation of $Ti_xO_ySi_z$.

BRIEF DESCRIPTION OF THE DRAWINGS

For a more complete understanding of the present invention, and the advantages thereof, reference is now made to the following descriptions taken in conjunction with the accompanying diagrams, in which.

DETAILED DESCRIPTION OF THE INVENTION

The preferred embodiment of the present invention and its advantages are best understood by referring to FIGS. 1a through 1e of the drawings, like numerals being used for like and corresponding parts of the various drawings. However, it should be appreciated that the present invention provides widely applicable inventive concepts, which can be embodied in a tremendous variety of specific contexts. The specific embodiment discussed is merely illustrative of a specific way to make and use the invention, and does delimit the scope of the invention.

Figure 1A:
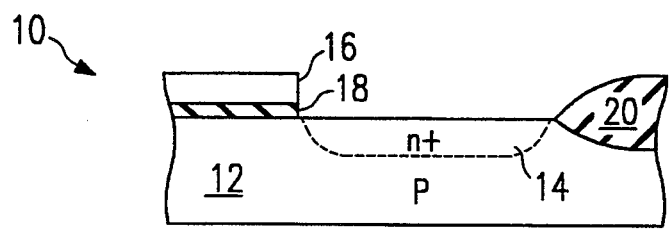
FIGS. 1a through 1e depict highly magnified sequential schematic cross-sectional views of a refractory metal silicide interconnect fabricated in accordance with the disclosed invention.

FIG. 1a depicts a portion of a field-effect transistor (FET) 10 known in the art, prior to making electrical contacts to the device. The portion of FET 10 depicted comprises a substrate 12, an (n+) source/drain region 14 (bounded by the dashed line) and a gate 16. Gate 16 is separated from the substrate 12 by a gate insulating layer 18 while FET 10 in general is electrically isolated from other devices on substrate 12 by field oxide region 20.

As is known in the art, substrate 12 may be a silicon substrate with a concentration of boron to produce a p-type material. Substrate 12 may be replaced with an epitaxial layer grown on the surface of a substrate. (N+) source/drain region 14 may be formed within substrate 12 by implanting arsenic, phosphorus, or a combination of the two to produce the region 14. Gate 16 may be fabricated from polysilicon doped with a suitable impurity to render it conductive. Field oxide region 20 may be formed using the local-oxidation-of-silicon (LOCOS) process prior to formation of gate 16 and source/drain 14, or the poly-buffered LOCOS (PBL) process.

Figure 1B:
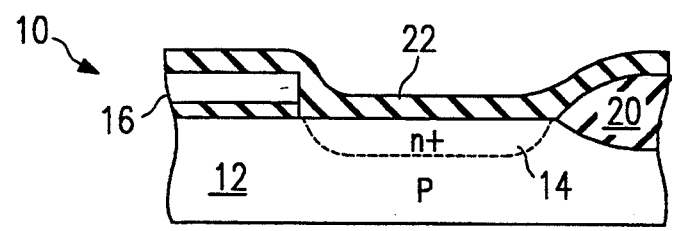

FIG. 1b depicts FET 10 after a layer 22 of silicon dioxide has been deposited onto transistor 10. The layer 22 may, for example, be deposited to a thickness on the order of a few thousand Angstroms.

Figure 1C:
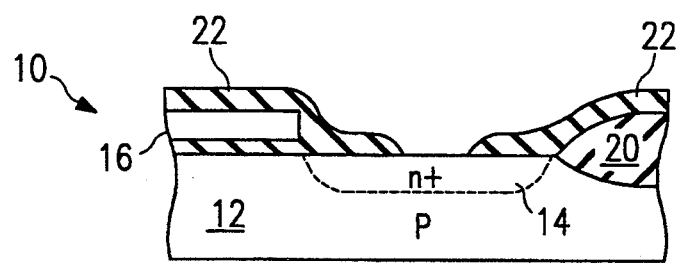

In FIG. 1c, a portion of the surface of (n+) source/drain region 14 is exposed. The surface of (n+) source/drain region 14 may be exposed using standard photolithographic processes such as masking layer 22 with a photoresist layer, patterning the resist layer, and etching with a suitable etchant to remove a portion of layer 22.

Figure 1D:
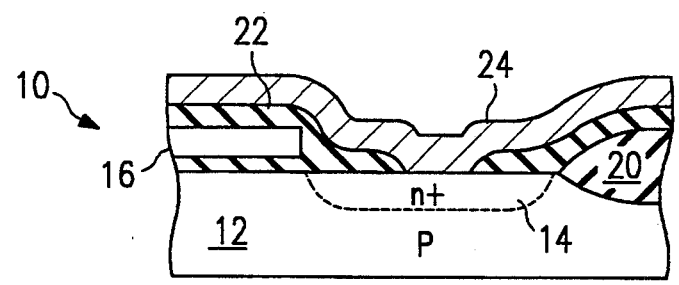

In FIG. 1d, a layer 24 of refractory metal is deposited onto transistor 10. The class of materials known as refractory metals include titanium, tungsten, cobalt and platinum and combinations thereof. In the preferred embodiment, layer 24 is a 1,000 Angstrom-thick layer of titanium.

Figure 1E:
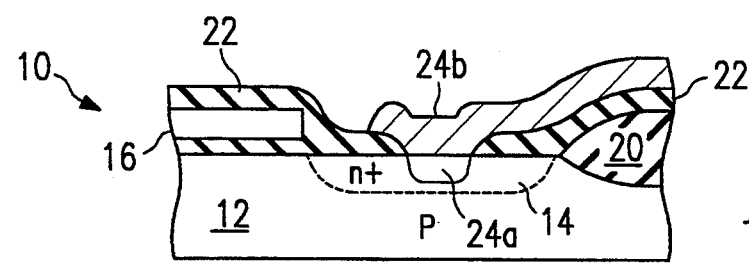

In FIG. 1e, layer 24 is reacted with a nitrogen ($N_2$) at a partial pressure greater that one atmosphere and at a temperature of 500° to 700° C. to form silicide layer 24a and nitride layer 24b. The extent of silicide layer 24a is depicted by the solid line within source/drain region 14. In the preferred embodiment, layer 24a is approximately 500 Angstroms of titanium disilicide and layer 24b is approximately 1,000 Angstroms of titanium nitride. Layer 24b will be slightly thinner, i.e. 900 Angstroms, over the contact via. A portion of the titanium will be consumed by the reaction with the silicon of substrate 12 to form titanium disilicide. This ratio is formed by exposing the titanium layer to nitrogen of a partial pressure of 10 atmospheres and a temperature of approximately 600° C. Such a low temperature will prevent significant formation of $Ti_xO_ySi_z$ at the boundary of layers 22 and 24. The resulting nitride layer 24b may serve as an interconnect between (n+) source/drain region 14 and an adjacent device (not shown). Layer 24b will also act as a diffusion barrier for (n+) source/drain region 14 during subsequent processing steps.

The titanium nitride layer may be masked, patterned and etched to produce the depicted device-to-device interconnection. One way of etching TiN employs a dry/wet etch combination. The dry etch is a $CF_4$ and He etch at 50° C. The wet etch is done in a Megasonic bath with a dilute solution of $H_2O_2$ and $NH_4OH$. This etch is selective to TiN over $TiSi_2$. If an interconnect is not desired, then all the TiN may be etched by omitting the nitride layer-patterning steps. Only the titanium disilicide layer 24a will remain after such a process.

If a first level or "global" interconnect is desired, then a suitable metal is deposited onto layer 24b to form a low resistance electrical pathway. Tungsten and/or aluminum alloys are commonly used for this purpose. TiN, although having a generally low resistance, is often too resistive for more lengthy global interconnects.

The disclosed invention is also useful in the self-aligned silicide ("Salicide") process. In the Salicide process, poly gate 16 and source/drain region 14 already contain a titanium disilicide region in their respective upper portions formed, for instance, by the disclosed process. Typically, the silicide layer in gate 16 and source/drain region 14 extends the full width of each structure. An insulating layer such as $SiO_2$ is then grown overall and a via is etched to expose gate 16, source/drain region 14 or both. A second layer of titanium is deposited onto the resulting surface and reacted with nitrogen as described above. The disclosed invention is advantageous because it is able to produce a thin titanium disilicide layer in gate 16 or source/drain region 14. This second growth of $TiSi_2$ must be thin to avoid "punching through" gate 16 or source/drain region 14 or electrically shorting the formed contact pad or interconnect to the underlying substrate.

Although the present invention and its advantages have been described in detail, it should be understood that various changes, substitutions and alterations can be made herein without departing from the spirit and scope of the invention as defined by the appended claims.

What is claimed is:

1. A method for forming a refractory metal silicide layer on a semiconductor device, the method comprising the steps of:
   exposing at least one region of elemental silicon of the device;
   depositing a layer of refractory metal on the device to cover the exposed region; and
   reacting nitrogen with the metal layer to form a layer of silicide having a first thickness adjacent said at least one exposed region of elemental silicon and a layer of nitride having a second thickness, the partial pressure of the nitrogen being greater than one atmosphere such that said second thickness is greater than said first thickness.

2. The method of claim 1 wherein the step of depositing comprises the step of depositing titanium on the device.

3. The method of claim 2 wherein the step of reacting comprises the step of reacting nitrogen with the metal layer at a partial pressure of 10 atmospheres and at a temperature of approximately 600° C.

4. The method of claim 1 wherein the step of reacting comprises the step of reacting the nitrogen with the metal layer at a partial pressure of 10 atmospheres and at a temperature of approximately 600° C.

5. The method of claim 1 further comprising the step of selectively etching the nitride over the silicide.

6. The method of claim 5 wherein the step of reacting comprises the step of reacting nitrogen with the metal layer at a partial pressure of 10 atmospheres and at a temperature of approximately 600° C.

7. A method for forming a local interconnect in conjunction with a silicide process comprising the steps of:
   forming a layer of refractory metal on a surface of a silicon substrate; and
   reacting the metal layer with nitrogen at a partial pressure greater than one atmosphere to form a layer of silicide upon said silicon substrate and a layer of nitride.

8. The method of claim 7 wherein the step of forming comprises the step of depositing titanium on the substrate.

9. The method of claim 8 wherein the step of reacting comprises the step of reacting nitrogen with the metal layer at a partial pressure of 10 atmospheres and at a temperature of approximately 600° C.

10. The method of claim 7, further comprising the step of etching said nitride layer to form said interconnect.

11. A method for forming a silicide/nitride bilayer on a silicon substrate comprising the steps of:
   depositing approximately 1,000 Angstroms of titanium onto the substrate, and
   forming a silicide/nitride bilayer under a partial pressure of nitrogen greater than one atmosphere, said silicide/nitride bilayer comprising approximately 500 Angstroms of $TiSi_2$ and 1,000 Angstroms of TiN.

* * * * *